Figure 1:
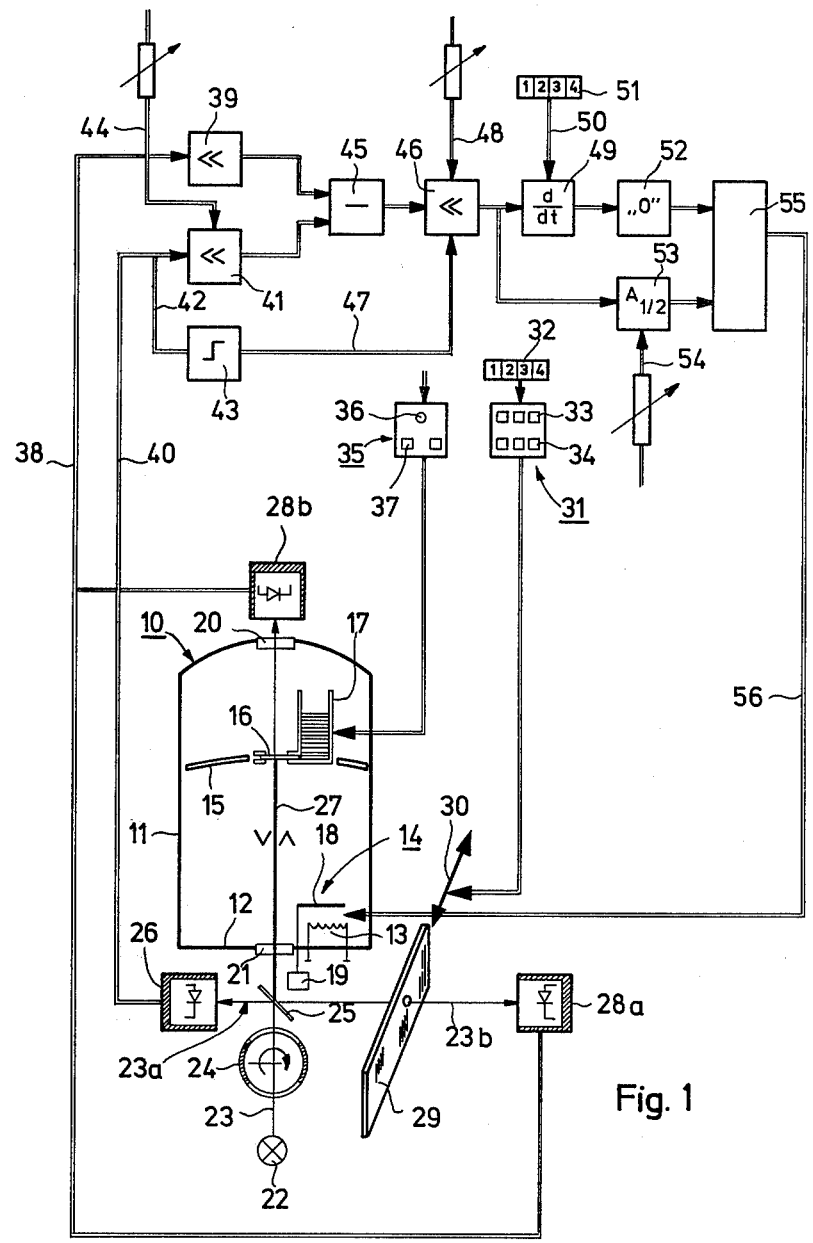

United States Patent [19]

Schwiecker et al.

[11] 4,207,835
[45] Jun. 17, 1980

[54] ARRANGEMENT AND PHOTOMETER FOR MEASURING AND CONTROLLING THE THICKNESS OF OPTICALLY ACTIVE THIN LAYERS

[75] Inventors: Horst Schwiecker, Kahl am Main; Gernot Thorn, Hanau am Main; Hans-Peter Ehrl, Aufkirchen, all of Fed. Rep. of Germany

[73] Assignee: leybold-Heraeus GmbH & Co. KG, Fed. Rep. of Germany

[21] Appl. No.: 807,290

[22] Filed: Jun. 16, 1977

[30] Foreign Application Priority Data

Jun. 21, 1976 [DE] Fed. Rep. of Germany ....... 2627753

[51] Int. Cl.² .............................................. C23C 13/00
[52] U.S. Cl. .................................... 118/664; 118/698; 118/712; 118/715
[58] Field of Search .................. 427/10; 118/8, 9, 48, 118/49, 49.1, 49.5, 664, 712, 696, 698, 715, 733, 699; 250/575, 571, 574, 233

[56] References Cited

U.S. PATENT DOCUMENTS

| | | | |
|---|---|---|---|
| 3,526,460 | 9/1970 | Webb | 118/9 X |
| 4,024,291 | 5/1977 | Wilmanns | 118/8 X |

FOREIGN PATENT DOCUMENTS

1079920 4/1960 Fed. Rep. of Germany ............. 118/48
1387607 3/1975 United Kingdom .

*Primary Examiner*—John P. McIntosh
*Attorney, Agent, or Firm*—Sprung, Felfe, Horn, Lynch & Kramer

[57] ABSTRACT

An arrangement and photometer for measuring and controlling the thickness of optically active thin layers wherein the axis of the measurement light beam coming from the measurement light source is directed to the measurement object and a referenced light receiver, independent of the optical properties of the measurement object, is associated with the measurement light beam. The output signal of the referenced light receiver is mixed with a trigger stage for a phase sensitive photometer amplifier and is fed to a compensation circuit for the equilization of brightness variations in the measurement light source.

21 Claims, 4 Drawing Figures

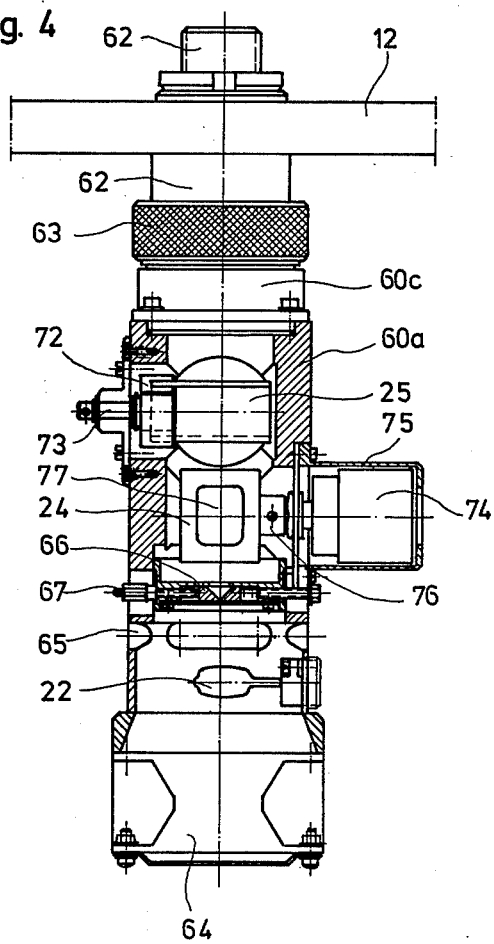

ARRANGEMENT AND PHOTOMETER FOR MEASURING AND CONTROLLING THE THICKNESS OF OPTICALLY ACTIVE THIN LAYERS

The invention relates to an arrangement for measuring and controlling the thickness of optically active thin layers during their formation in vacuum coating installations, by detecting the reflection and transmission behaviour of layer thicknesses between fractions and some multiples of the wavelength of the essentially monochromatic measurement light used, and by interrupting the coating process when a predetermined layer thickness has been obtained, said arrangement consisting of a measurement light source for emitting a focused measurement light beam, a chopper device, a beam divider arranged at an angle of 45 degrees on the axis of the measurement light beam, that part of the measurement light beam passing behind the beam divider being directed on the measurement object, a measurement light receiver with a monochromator connected thereto, as well as a differentiation device for the measurement signal and an interruption device for the coating process.

The reliability of such an arrangement and the reproducibility of the thin films produced thereby depends to a large extent on the optical and electrical stability of all the elements in this arrangement. The stability is particularly affected by a plurality of optical elements, by drifting of receivers and amplifiers, and by the almost unavoidable instabilities in the measurement light source.

An arrangement of the type described at the beginning is disclosed in German Auslegeschrift No. 1,079,920. This prior art arrangement has the further feature that the axis of the measurement light receiver is orientated at a right-angle to the axis of the measurement light beam and to the beam divider in such a way that light reflected from the measurement object strikes the measurement light receiver. This prior art arrangement is accordingly only suitable for measuring the reflection behaviour of optical thin layers.

In the prior art arrangement a second light beam, a so-called standard beam, passes during its indirect path via a complicated optical device with a plurality of deflecting mirrors through a continuous intensity reducer to the same measurement light receiver as the actual measurement light or control light beam. The complicated beam guidance of the standard beam requires not only deflecting mirrors but also optical lens systems in order to focus the light beam. The prior art arrangement serves to carry out a null balance at the beginning of the formation of each individual layer in a multi-layer system. Any drifting of the measurement light source (variations in brightness), intensifier and measurement light receiver cannot be compensated in this way. Each change in brightness, degree of intensification and/or sensitivity, which can also have an additive effect, falsifies the measurement result and therefore the layer properties, in particular in the case of multiple or interference systems. Since, on account of the instability of the prior art arrangement, each layer has to be measured individually by evaporating a new point of a test glass, there is a considerable danger that any measurement errors will tend to be repeated in all layers, and accordingly the end result of the layer system will not correspond to the calculated value and is not reproducible. With the known device the optical autocompensation effect is not practicable for the aforementioned reasons. By autocompensation is understood the effect of compensating for variations with respect to the properties of individual layers by intentionally providing subsequent layers with the opposite algebraic sign.

It is also known to differentiate the measured values of an arrangement of the afore-described type in order to obtain defined zero passages of the differentiated signal and to be able to interrupt the coating process when a maximum or minimum of the undifferentiated signal (original signal) occurs (German Pat. Spec. No. 1,214,970 and German Auslegeschrift No. 1,276,976).

However, in the methods and arrangements described therein no particular attention was paid to the stability of the measurement signals and measurement arrangements employed.

The object of the invention is therefore to provide an arrangement of the type described at the beginning for measuring and controlling the thickness of layers, which is characterised by a high degree of stability during prolonged coating processes and thus provides a good reproducibility, also in the case of multiple layers, of the results obtained.

The solution of the above problem is provided in accordance with the invention in the case of the arrangement mentioned at the beginning, by the combination of the following features:

(a) The axis of the measurement light beam coming from the measurement light source is directed to the measurement object, (b) a reference light receiver independent of the optical properties of the measurement object is associated with the measurement light beam, and (c) the output signal of the reference light receiver is mixed with a trigger stage for a phase-sensitive photometer amplifier and fed to a compensation circuit for the equalization of brightness variations in the measurement light source.

With respect to feature (a), it should be noted that the position of the measurement light source on the one hand and the measurement light receiver on the other hand have been interchanged compared with the prior art. Whereas in the prior art arrangement the beam path between the measurement light source and the measurement object (test glass) is deflected by 90 degrees, the relevant beam path in the arrangement according to the invention is substantially rectilinear. This makes it possible to arrange both a measurement light receiver and also a reference light receiver symmetrically with respect to the axis of the measurement light beam, the position of the beam divider being such that the measurement light beam first of all (partially) passes through the beam divider, is reflected at the measurement object, returns along the same axis to the beam divider, and is there deflected to the measurement light receiver. On the other hand that part of the original measurement light beam reflected at the beam divider passes directly to the reference light receiver.

Such an arrangement is characterised by the smallest possible number of optical elements, which are moreover extremely compact and can be immovably arranged with respect to one another. By means of the reference light receiver and the mentioned circuit arrangements, variations caused by the radiation receiver, intensifier and measurement light source are compensated at all times during the evaporation process, and accordingly a null balance in the case of multiple layers is no longer necessary after applying each individual layer. In this way it is possible to evaporate the multilayer system on a single test glass or at the same point of a test glass, with the result that a so-called optical auto-compensation is automatically produced since the overall optical effect of all the previously deposited layers can be measured. It has been surprisingly found that single layer and multilayer systems can be deposited in the above manner, whose layer thicknesses are up to 20 times the wave-length of the measurement light employed. Such a resolution of maxima and minima of the measured interference curves is not possible with the hitherto known methods and arrangements.

By means of the arrangement according to the invention layer systems can be reproducibly produced, and therefore it is not necessary to generate fairly large amounts of optical products whose properties are, within certain limits, left to chance, with the result that end products with approximately the same properties have to be chosen from the multiplicity of working results.

The arrangement in accordance with the invention can be used in a simple manner both for reflection and for transmission measurements. This is done quite simply by altering the placement position of the measurement light receiver, whereas the reference light receiver remains at the same place. In the case of a reflection measurement the arrangement according to the invention is formed in such a way that the axis of the measurement light receiver, at a right-angle to the axis of the measurement light beam, is orientated towards the beam divider in such a way that the light reflected from the measurement object strikes the measurement light receiver.

In the case of a transmission measurement the measurement light receiver is transferred so that its axis is identical to the axis of the measurement light beam, and so that, when viewed from the measurement light source, it is arranged behind the measurement object. In such an arrangement the measurement light source and measurement light receiver are generally on different sides of the vaccuum chamber.

The reference light receiver can be coordinated with the measurement light beam in a different manner. It would be conceivable to have a further light divider, arranged in the measurement light beam before the latter reaches the measurement object, so that a part of the measurement light is blocked out as a reference light. It is however particularly advantageous also to orientate the axis of the reference light receiver, at a right-angle to the axis of the measurement light beam, towards the beam divider so that light coming directly from the measurement light source strikes the reference light receiver. In such a case the same beam divider can be used to transmit light to both the measurement light receiver and also to the reference light receiver. The overall arrangement of all the optically active elements in this way forms a type of cross of a very exact geometric configuration.

In order that the total arrangement can be used to carry out measurements with different wave-lengths of the measurement light, the necessary monochromator is formed by an interference gradient filter which can be adjusted by means of a step motor. A remote control and adjustment is thus made possible, which can be indicated digitally on a switchboard. The adjustment of the wave-length of the measurement light is also carried out from the switchboard by means of digital adjustment means, and the agreement between actual values and desired values can easily be checked at any time by an appropriate indication means.

Furthermore, it is particularly convenient to arrange an encoding member for the change in the time constant of the differentiation process as a function of the coating duration, in conjunction with the differentiation and interruption device. By means of such an encoding member several different time constants for various coating materials may for example be adjusted, corresponding to the coating duration. Separate buttons are conveniently used for the individual time constants.

Finally, the constancy of the chopper frequency also has a considerable influence on the stability of the arrangement. In order to achieve a high degree of uniformity in the chopper frequency, it is furthermore proposed to drive the chopper device by a quartz-regulated motor.

The arrangement according to the invention creates particularly favourable constructional prerequisites for the coordination of the optical parts of the arrangement to form a so-called photometer. This is characterised by the fact that the measurement light source, chopper device, beam divider, measurement light receiver and reference light receiver are arranged in a roughly cruciform housing at whose central point the beam divider is arranged, and that the arm remote from the measurement light source is provided with means so that it can be incorporated in one wall of a vacuum chamber. The expression "cruciform housing" includes all possible housing shapes. In principle it is sufficient to have four channels, which are provided for the measurement light beam, its optical system (objective), the measurement light receiver and the reference light receiver, in a relatively rigid housing.

Such a photometer is simply joined from the outside on to a vacuum chamber, for example to the base plate of a bell-type evaporation installation, only a housing opening with corresponding securement means having to be provided at the placement position. All the individual parts of such a photometer are easily accessible from outside. In this regard, if in addition the connection between the measurement light receiver and the housing is made so that it can easily be released, the measurement light receiver can easily be mounted on a corresponding connection member at an opposite opening of the vacuum chamber, with the result that the whole photometer arrangement can be used immediately for making transmission measurements.

The subject matter of the invention can be used both in the case of measurements directly on the coated substrate and also in the case of measurements on auxiliary carriers, such as for example test glasses in conjunction with a test glass exchanger. This possibility of choice is also in contrast to the state of the art, in which the measurements in question can be carried out only on test glasses because each layer must be measured individually in the case of multi-layers.

Figure 2:
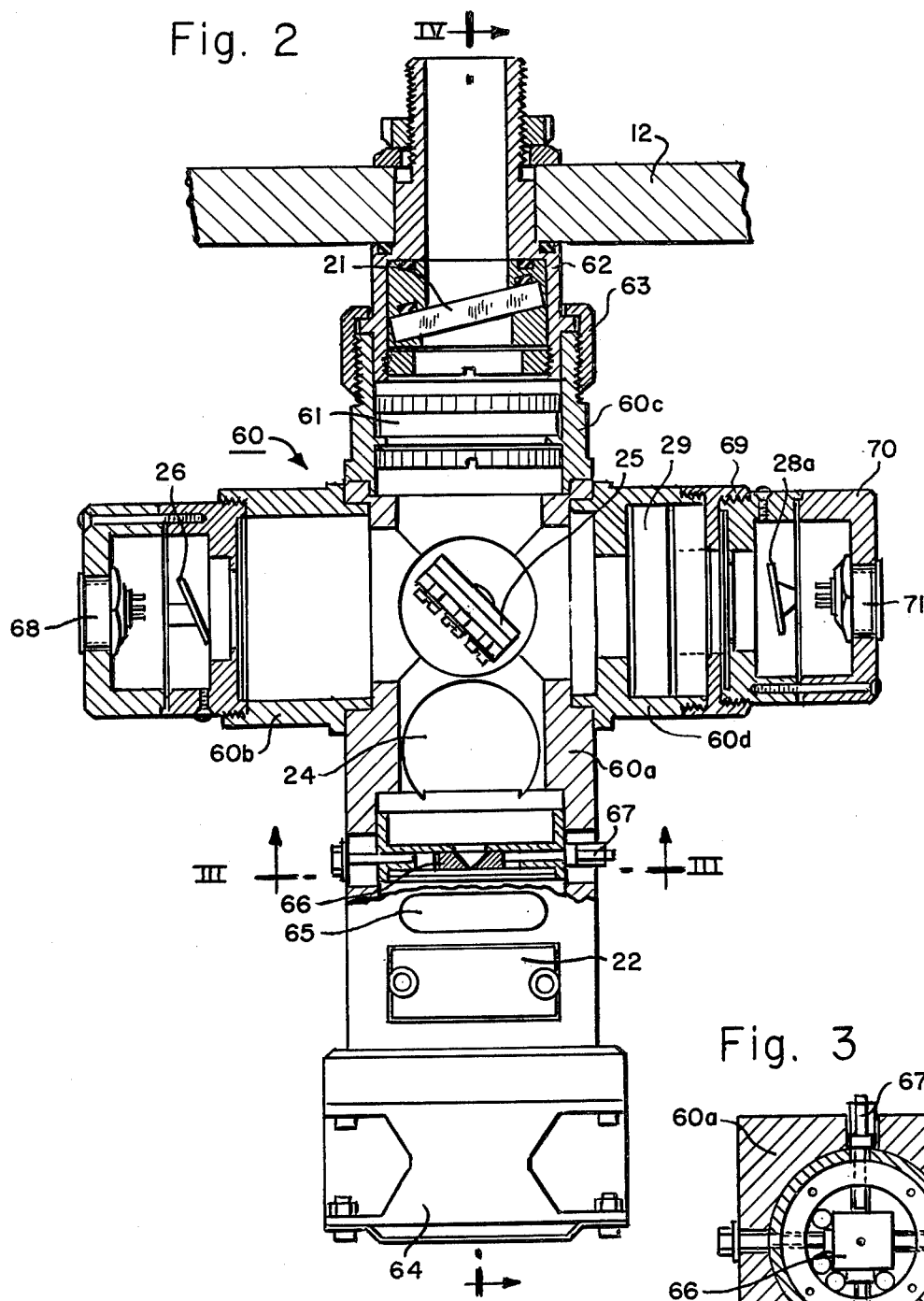
Figure 3:
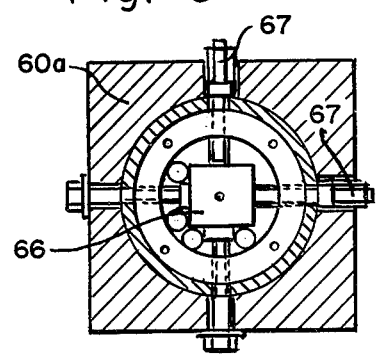

One embodiment of the arrangement according to the invention and the photometer for this arrangement is described in more detail hereinafter, with the aid of FIGS. 1 to 4, in which:

FIG. 1 shows a vacuum evaporation installation with the photometer and evaluation arrangement according to the invention, FIG. 2 is a vertical section through a photometer arrangement according to FIG. 1 combined in a single constructional unit, FIG. 3 is a section through the object according to FIG. 2, along the line III—III, and FIG. 4 is a vertical section through the object according to FIG. 2, along the line IV—IV.

In FIG. 1 a vacuum evaporation installation, formed as a so-called bell-type installation, is designated by the reference numeral 10 and consists of a vacuum chamber 11 in the form of a bell closed off at the bottom by means of a wall 12 serving as a base plate for the vacuum chamber 11. An evaporator 13, an interruption device 14 for the vapour beam, a substrate holder 15 and a measurement object 16 are arranged in the vacuum chamber, the said measurement object being for example a test glass released from the magazine of a test glass exchanger 17. The interruption device 14 consists of a diaphragm 18 which can swivel above the evaporator 13, and a diaphragm drive 19. The above-described arrangement belongs to the state of the art and is therefore only shown diagrammatically.

In the vacuum chamber 11 are located two transparent windows 20 and 21 on a common axial orientation, the arrangement being such that the lower window 21 is situated in the wall 12. A measurement light source 22 is located underneath the vacuum chamber 11 in the direction of the axis passing through both windows, and a chopper device 24 for the measurement light beam 23 is inserted in the path of the said light beam. The chopper device consists of a cylindrical drum driven by a quartz-regulated motor, the said drum having slits for the passage of the light beam on two diametrically opposite points.

Between the chopper device 24 and the lower window 21 is located a beam divider 25 in the axis of the measurement light beam 23, which consists of a partially transparent mirror and is orientated at an angle of 45 degrees to the axis of the measurement light beam. A part of the measurement light beam is deflected by the beam divider at an angle of 90 degrees in the direction of the arrow 23a, and strikes a reference light receiver 26 orientated towards the beam divider 25. That part of the measurement light beam 23 which penetrates the beam divider 25 passes through the window 21 and strikes the measurement object 16, which is likewise arranged on the optical axis of the system. At the measurement object 16 the remaining part of the measurement light beam 23 is again—at least partially—reflected, and deflected back along the optical axis 27 to the beam divider 25. At the beam divider 25 that part of the measurement light beam coming from above is likewise deflected at an angle of 90 degrees, namely in the direction of the arrow 23b, in the opposite direction to the arrow 23a. The optical axes and beam paths thus form a right-angled cross.

In the beam path (arrow 23b) is located a measurement light receiver 28a in front of which is inserted a monochromator 29 that "sensitizes" the measurement light receiver for a quite specific wave-length.

The monochromator 29 consists of an interference gradient filter which can be brought by means of a step motor 30 into a defined position with respect to the measurement light beam incident on the measurement light receiver 28a. The step motor 30 is likewise only shown symbolically. It receives its position instructions from a digital control unit 31 which can be influenced by a digital transducer 32 and has a desired value indicator 33 and a feedback actual value indicator 34.

The measurement light receiver 28a can also be brought to the position of the measurement light receiver 28b, in which it receives that part of the measurement light beam 23 which has passed through the measurement object 16 and the upper window 20. In this connection, the monochromator 29 is also coordinated with the measurement light receiver 28b.

The test glass exchanger 17 is likewise connected to a control unit 35, provided with a push-button 36, a counter (not shown), and a counter indicator 37.

The electrical signal coming from the measurement light receiver 28a (reflection measurement) or 28b (transmission measurement) is passed via a line 38 to an input amplifier 39. The signal generated by the reference light receiver 26 is passed via a line 40 to a compensation amplifier 41 and, parallel thereto, via a line 42 to a trigger stage 43 which supplies the necessary control impulse for the phase-sensitive photometer amplifier, described in more detail hereinafter. An adjustable voltage for altering the degree of amplification is fed to the compensation amplifier 41 via a line 44.

The outputs from the amplifiers 39 and 41 are fed to a comparator 45 in which either the difference or the quotient of both amplifier output signals can be formed. The output signal from the comparator 45 is fed to a phase-sensitive photometer amplifier 46, which receives its control signal regarding the phase position from the trigger stage 43 via a line 47. The photometer amplifier 46 receives signals for an alteration in the degree of amplification via a further input 48 in the form of an analogue voltage.

The output signal from the photometer amplifier 46 is a continuous signal and is passed to a differentiation member 49, to which a digital signal from an encoding member 51 is passed via a further input 50, by means of which the time constant of the differentiation member 49 can be adjusted. A null detector 52 is connected to the differentiation member, the said detector always emitting a signal at its output if the differentiated signal at the output of the differentiation member 49 has a zero passage. The null detector 52 contains an integrated counter which retains the number of zero passages, compares the said number with a preselected number, and allows a signal to be emitted at its output when the said preselected number is reached.

A comparator 53 is arranged parallel thereto, in which the actual intensity value of the photometer amplifier 46 is compared with a predetermined analogue desired intensity value via a further input 54. As soon as the actual intensity value reaches the desired intensity value, a short impulse is emitted and passed to a logic circuit 55, which also retains the output signals from the null detector 52. The logic circuit 55 can act as an AND-operator or OR-operator, namely in conjunction with the activation or non-activation of the null detector 52 and of the comparator 53. This arrangement fulfills the following objectives:

(a) If the switch-off at a certain layer thickness value is intended to take place exactly with one or more zero passages of the differentiation member 49, then the comparator 53 is inactivated. The switch-off then takes place exactly at the pre-selected counter value. Such a method of operating the arrangement is actuated by hand if an integral multiple of $\frac{1}{4}\lambda$ layer thicknesses is intended to be formed.

(b) If the switch-off is to take place before the first zero passage at the differentiation member 49, the null detector 52 is inactivated and the comparator 53 causes the switch-off to take place as soon as the actual value and desired value agree. Such a method of operation is adopted if layer thicknesses are to be produced which lie between the value 0 and ¼λ of the measurement light used.

(c) If however the switch-off is to take place at a specific layer thickness between two arbitrary zero passages, the null detector 52 and the comparator 53 are activated so that they act in conjunction with the logic circuit 55 as an AND-circuit. The result of this is that a signal can only be transmitted when the preselected number of zero passages has been reached and accordingly there is a new agreement between the actual intensity value and the desired intensity value. Since the impulses at the output of the null detector 52 and of the comparator 53 do not occur simultaneously, the first of these impulses (counting impulse) is retained in the logic circuit 55 until the impulse from the comparator 53 enters.

As soon as the logic circuit 55 is switched through, the diaphragm drive 19 of the diaphragm 18 receives an impulse via a line 56, which rotates the diaphragm into the vapour stream from the evaporator 13 and interrupts said vapour stream in the direction of the substrate holder 15 and the measurement object 16.

The method of operation given in (c) makes it possible to interrupt the coating process in an advantageous manner as soon as the desired layer thickness has been reached, without having to take into account the zero passages and make complicated conversions with respect to the intermediate values.

In FIGS. 2 to 4 the same reference numerals as hitherto are retained.

In FIG. 2 it can be seen that the measurement light source 22, chopper device 24, beam divider 25, measurement light receiver 28a and reference light receiver 26 are arranged in an approximately cruciform housing 60. The housing itself is composed of several individual parts, such as a main body 60a and three tubular members 60b, 60c and 60d. The optical axis 27 (FIG. 1) coincides with the longitudinal axis of the main body 60a. The axes of the tubular members 60b and 60d intersect the axis of the main body 60a at a right-angle. The tubular member 60c also runs coaxially to the optical axis, and a lens 61 is situated therein. The tubular member 60c is provided with an external screwthread by means of which it can be screwed, with a connection member 62, into the wall 12 of the vacuum chamber. A sleeve nut 63 serves for this purpose. In the interior of the connection member 62 is also located the lower window 21, which is inclined to the optical axis in order to avoid interfering reflections. Up to the window 21 all the parts are made vacuum-tight with respect to one another by means of interposed seals (not shown in detail).

The tubular member 60c forms an arm of the cruciform housing. A casing 64 connected to the main body 60a is located opposite the afore-mentioned arm, and has a cooling fan (not shown) with a drive motor, for cooling the measurement light source 22. Housing perforations 65 are provided for air circulation. Between the measurement light source 22 and the chopper device 24 is located an optical diaphragm 66, which can be displaced in a radial direction with respect to the main body 60a by means of adjustment screws 67. The possibilities of adjustment can be seen in FIG. 3.

A reference light receiver 26 is arranged on the tubular member 60b, pointing to the left in FIG. 2. The electrical connection is made via a plug connection 68. The monochromator 29 is housed within a slit-shaped recess on the tubular member 60d pointing towards the right in FIG. 2. A casing 70 in which the measurement light receiver 28a is mounted is attached to the outer end by means of an easily removable bolt connection 69. A plug connection 71 serves for the electrical connection. Photodiodes are preferably used as measurement and reference light receivers in the UV range, and so-called pyro-electric receivers are preferably used in the longer wave-length range.

The housing shape shown in FIG. 2 forms two rectangular crossing channels, at whose ends the active parts of the photometer are arranged. The beam divider 25 is located at the crossing point and can be adjusted as regards its angular orientation. This adjustment is carried out according to FIG. 4 by securing the beam divider 25 in a holder 72 which is over-mounted on an adjustment shaft 73 passing through the main body 60a.

The drive means for the chopper device 24 can be seen in FIG. 4. The drive motor 74 is located in a lateral flanged-on housing projection 75, and is connected via a shaft 76 to the rotating, cylindrical part of the chopper device. Holes 77 serve for the passage of the measurement light beam.

We claim:

1. Arrangement for measuring and controlling the thickness of optically active thin layers during their formation in vacuum coating installations, by detecting the relection or transmission behavior of layer thicknesses between fractions and some multiples of the wave-length of the essentially monochromatic measurement light used, and by interrupting the coating process when a predetermined layer thickness has been obtained, said arrangement comprising: a measurement light source for emitting a focused measurement light beam having the axis thereof directed towards the measurement object, a beam divider positioned at an angle of 45 degrees relative to the axis of the measurement light beam between the source and the measurement object for directly reflecting one portion 90° and transmitting another portion behind the beam divider and directed on the measurement object, a chopper device disposed between the source and the divider, a measurement light receiver receptive of the light coming from the measurement object for producing a corresponding measurement signal and having a monochromator connected thereto, a reference light receiver receptive of the reflected portion of the beam and independent of the optical properties of the measurement object for producing a corresponding reference light signal, a phase sensitive photometerr amplifier having a trigger stage receptive of the reference light signal and parallel thereto a compensation circuit receptive of the reference light signal for equalizing brightness variations of the measurement light source, an input amplifier receptive of the measurement signal, a comparator receptive of the outputs of the input amplifier and the compensation circuit and having the output thereof applied to the input of the phase sensitive photometer amplifier, a differentiating circuit receptive of the output of the phase sensitive photometer amplifier, a null detector receptive of the output of the differentiating circuit and a circuit for effecting interruption of the coating process receptive of the output of the null detector.

2. Arrangement according to claim 1, wherein the interruption circuit includes means for effecting interruption of the coating process at a specific zero passage, when a desired value is first reached, or when the desired value is reached after a predetermined number of zero passages.

3. Arrangement according to claim 1, wherein the axis of the measurement light receiver is at a right-angle to the axis of the measurement light beam and the measurement light receiver receives light reflected back from the measurement object.

4. Arrangement according to claim 1, wherein the axis of the measurement light receiver is identical to the axis of the measurement light beam, and the measurement light receiver, seen from the measurement light source, is arranged behind the measurement object so that the light that has passed through the measurement object strikes the measurement light receiver.

5. Arrangement according to claim 1 wherein the axis of the reference light receiver is at a right-angle to the axis of the measurement light beam and is orientated towards the beam divider so that the light coming directly from the measurement light source strikes the reference light receiver.

6. Arrangement according to claim 1, wherein the monochromator comprises an interference gradient filter and a step motor for adjusting same.

7. Arrangement according to claim 1, further comprising an encoding member coactive with the differentiating circuit for altering the time constant of the differentiation as a function of the coating duration.

8. Arrangement according to claim 1, wherein the chopper device is driven by a quartz-regulated motor.

9. Photometer for use in the arrangement according to claim 1, comprising a substantially cruciform housing and wherein the measurement light source, chopper device, beam divider, measurment light receiver and reference light receiver are arranged in the cruciform housing at points therealong and at whose crossing point is arranged the beam divider, and that the arm of the housing remote from the measurement light source is provided with means for incorporating same in a wall of a vacuum chamber.

10. Photometer according to claim 9, further comprising means for removable connecting at least the measurement light receiver and the housing so that the measurement light receiver is easily removable.

11. Photometer according to claim 9, further comprising a diaphragm associated with the measurement light source and means for radially adjusting same through the wall of the housing.

12. Photometer according to claim 9, further comprising means for adjusting the angular orientation of the beam divider through the wall of the housing.

13. Arrangement for measuring and controlling the thickness of optically active thin layers during their formation in vacuum coating installations, by detecting the reflection or transmission behavior of layer thicknesses between fractions and some multiples of the wave-length of the essentially monochromatic measurement light used, and by interrupting the coating process when a predetermined layer thickness has been obtained, said arrangement comprising: a measurement light source for emitting a focused measurement light beam having the axis thereof directed towards the measurement object, a beam divider positioned at an angle of 45 degrees relative to the axis of the measurement light beam between the source and the measurement object for directly reflecting one portion 90° and transmitting another portion behind the beam divider and directed on the measurement object, a chopper device disposed between the source and the divider, a measurement light receiver receptive of the light coming from the measurement object for producing a corresponding measurement signal and having a monochromator connected thereto, a reference light receiver receptive of the reflected portion of the beam and independent of the optical properties of the measurement object for producing a corresponding reference light signal, circuit means receptive of the reference light signal and the measurement signal for effective interruption of the coating process when a desired coating thickness is obtained and a substantially cruciform housing wherein the measurement light source, chopper device, beam divider, measurement light receiver and reference light receiver are arranged in the cruciform housing at points therealong and at whose crossing point is arranged the beam divider, and that the arm of the housing remote from the measurement light source is provided with means for incorporating same in a wall of a vacuum chamber.

14. Arrangement according to claim 13, wherein the axis of the measurement light receiver is at a right-angle to the axis of the measurement light beam and the measurement light receiver receives light reflected back from the measurement object.

15. Arrangement according to claim 13, wherein the axis of the measurement light receiver is identical to the axis of the measurement light beam, and the measurement light receiver, seen from the measurement light source, is arranged behind the measurement object so that the light that has passed through the measurement object strikes the measurement light receiver.

16. Arrangement according to claim 13, wherein the axis of the reference light receiver is at a right-angle to the axis of the measurement light beam and is orientated towards the beam divider so that the light coming directly from the measurement light source strikes the reference light receiver.

17. Arrangement according to claim 13, wherein the monochromator comprises an interference gradient filter and a step motor for adjusting same.

18. Arrangement according to claim 13, wherein the chopper device is driven by a quartz-regulated motor.

19. Photometer according to claim 13, further comprising means for removable connecting at least the measurement light receiver and the housing so that the measurement light receiver is easily removable.

20. Photometer according to claim 13, further comprising a diaphragm associated with the measurement light source and means for radially adjusting same through the wall of the housing.

21. Photometer according to claim 13, further comprising means for adjusting the angular orientation of the beam divider through the wall of the housing.

* * * * *

UNITED STATES PATENT AND TRADEMARK OFFICE
CERTIFICATE OF CORRECTION

PATENT NO. : 4,207,835
DATED : June 17, 1980
INVENTOR(S) : Horst Schwiecker et al It is certified that error appears in the above-identified patent and that said Letters Patent are hereby corrected as shown below:

Title Page, Assignee: "leybold-Heraeus" should read
-- Leybold-Heraeus --.

References Cited should include:
-- 4,023,... 5/1977 Ross............250/575X --

Abstract  "equilization" should read
-- equalization --.

Col. 8, line 57  "photometerr" should read
-- photometer--.

Signed and Sealed this

Fourteenth Day of October 1980

[SEAL]

Attest:

SIDNEY A. DIAMOND

Attesting Officer   Commissioner of Patents and Trademark